(12) United States Patent
Shinozuka et al.

(10) Patent No.: US 7,529,595 B2
(45) Date of Patent: May 5, 2009

(54) METHOD OF CONTROLLING SUBSTRATE PROCESSING APPARATUS AND SUBSTRATE PROCESSING APPARATUS

(75) Inventors: Shinichi Shinozuka, Koshi (JP); Shigeki Wada, Koshi (JP); Masami Yamashita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 312 days.

(21) Appl. No.: 10/581,073

(22) PCT Filed: Nov. 30, 2004

(86) PCT No.: PCT/JP2004/017752

§ 371 (c)(1),
(2), (4) Date: May 31, 2006

(87) PCT Pub. No.: WO2005/057633

PCT Pub. Date: Jun. 23, 2005

(65) Prior Publication Data

US 2007/0088450 A1 Apr. 19, 2007

(30) Foreign Application Priority Data

Dec. 9, 2003 (JP) .............................. 2003-410105

(51) Int. Cl.
*G06F 19/00* (2006.01)

(52) U.S. Cl. .................... 700/121; 700/95; 700/112; 700/114; 700/117

(58) Field of Classification Search ............ 700/95, 700/112, 114, 117, 121; 430/30
See application file for complete search history.

(56) References Cited

U.S. PATENT DOCUMENTS 6,593,045 B2 * 7/2003 Sato et al. .................... 430/30

(Continued)

FOREIGN PATENT DOCUMENTS

JP 10-172902 6/1998

(Continued)

OTHER PUBLICATIONS

Notification of Transmittal of Copies of Translation of the International Preliminary Report on Patentability (Form PCT/IB/338)—PCT/JP2004/017752, dated Jan. 2004.

(Continued)

*Primary Examiner*—Ronald D Hartman, Jr.
(74) *Attorney, Agent, or Firm*—Smith, Gambrell & Russell, LLP

(57) ABSTRACT

It is an object of the present invention to realize, in a coating and developing apparatus including an inspection section, reduction in the startup time, cost reduction, and an improved operating rate of the inspection section.

In the present invention, a control program of the coating and developing apparatus is set such that a processing flow and an inspection flow can be independently executed, the processing flow being a flow in which a substrate is carried to a processing station from a cassette station to be processed in the processing station and an aligner and thereafter is returned to the cassette station, and the inspection flow being a flow in which the substrate is carried from the cassette station to an inspection station to be inspected there, and is thereafter returned to the cassette station. At startup of the coating and developing apparatus, the inspection flow and the processing flow are executed, and an evaluation work of an inspection unit of the inspection station and an adjustment work of a processing unit in the processing station can proceed simultaneously. When the inspection station is idle, a substrate can be carried from an external part to the cassette station to be inspected there.

14 Claims, 8 Drawing Sheets

U.S. PATENT DOCUMENTS

| | | | |
|---|---|---|---|
| 2002/0009658 A1* | 1/2002 | Sato et al. | 430/30 |
| 2002/0037462 A1* | 3/2002 | Ogata et al. | 430/30 |
| 2005/0271382 A1* | 12/2005 | Ogata et al. | 396/611 |

FOREIGN PATENT DOCUMENTS

| | | |
|---|---|---|
| JP | 2000-223401 | 8/2000 |
| JP | 2003-037043 | 2/2003 |
| JP | 2003-045776 | 2/2003 |
| JP | 2003-115426 | 4/2003 |

OTHER PUBLICATIONS

PCT International Preliminary Report on Patentability (Form PCT/IB/373)—PCT/JP2004/017752, dated Jan. 2004.

Translation of PCT Written Opinion of the International Searching Authority—(Form PCT/ISA/237)—PCT/JP2004/017752, dated Jan. 2004.

* cited by examiner

METHOD OF CONTROLLING SUBSTRATE PROCESSING APPARATUS AND SUBSTRATE PROCESSING APPARATUS

TECHNICAL FIELD

The present invention relates to a method of controlling a substrate processing apparatus and a substrate processing apparatus.

BACKGROUND

A coating and developing apparatus is usually used for a photolithography step of a substrate in manufacturing processes of, for example, a semiconductor device. The coating and developing apparatus includes: a loader/unloader section loading/unloading the substrate into/out of an apparatus main body; a processing section in which a series of a plurality of processes such as resist coating processing, development processing, and heat treatment are performed; and an interface section delivering the substrate to/from an aligner provided adjacent to the apparatus, and each of these sections has a carrier unit carrying the substrate to/from the adjacent sections.

In recent years, there has been also proposed a coating and developing apparatus including an inspection section that inspects film thickness, line width, and so on of a substrate that has been processed (see, for example, Patent document 1). According to this coating and developing apparatus, it is possible to inspect the substrate immediately after it is processed to thereby detect trouble and the like of the substrate processing at an early stage.

Conventionally, a flow of the substrate processing executed in a coating and developing apparatus is controlled by, for example a control section in the coating and developing apparatus. In a control section of a conventional coating and developing apparatus not provided with the aforesaid inspection section, a flow is set such that a substrate carried from the loader/unloader section is carried into the processing section to be processed there, and the substrate having undergone the processing is returned to the loader/unloader section. In a flow set in a control section of a coating and developing apparatus provided with the aforesaid inspection section, the inspection flow in the inspection section is combined with the conventional flow, and more specifically, substrates carried from the loader/unloader section are carried to the processing section to be processed therein, a substrate selected from the substrates having been processed is inspected in the inspection section, and all the substrates are thereafter returned to the loader/unloader section. Therefore, when carried into the loader/unloader section, the substrates to be processed in the coating and developing apparatus are all sure to be carried to the processing section and processed therein and are selectively inspected in the inspection section thereafter.

At startup of the coating and developing apparatus, an adjustment work of adjusting various kinds of settings and so on of processing units in the processing section and an evaluation work of evaluating accuracy and the like of the inspection section are necessary. The adjustment work of the processing section and the evaluation work of the inspection section have to proceed separately in order to exclude external factors. However, in the coating and developing apparatus including the aforesaid inspection section, when the flow of the substrate processing is executed, the substrate is sure to pass through the processing section, so that external disturbance is applied to the substrate and thus the execution of the flow hinders the evaluation work of the inspection section. Therefore, for performing the evaluation work of the inspection section, a specialized evaluation unit including a mechanism carrying a substrate directly into/from the inspection section is separately provided adjacent to the inspection section, thereby carrying the substrate into/from the inspection section from/to the evaluation unit. Therefore, the specialized evaluation unit is required for the startup work of the coating and developing apparatus, which burdens, for example, a substrate manufacturer with purchase cost and maintenance cost of the evaluation unit and burdens an apparatus manufacturer and an inspection device manufacturer with development cost and development labor of the evaluation unit.

In addition, it is quite natural that the adjustment work of the processing section, which is performed by making a substrate actually flow, cannot be performed while the evaluation work of the inspection section, which uses the specialized evaluation unit, is in progress. Thus, conventionally, simultaneous execution of the evaluation work of the inspection section and the adjustment work of the processing section was not possible, resulting in an extensive amount of the startup time of the coating and developing apparatus.

Moreover, during the substrate processing in the coating and developing apparatus, one substrate per a predetermined number of substrates is inspected in many cases and thus the inspection section is often in an idle state. Therefore, improvement in operating rate of the inspection section and efficient utilization of the inspection section are demanded.

[Patent document 1] Japanese Patent Application Laid-open No. 2000-223401

DISCLOSURE OF THE INVENTION

Problems to Be Solved by the Invention

The present invention was made in consideration of the above-described circumstances, and an object thereof is to provide a method of controlling a substrate processing apparatus capable of realizing reduction in the startup time of the apparatus, cost reduction, and an improved operating rate of an inspection section in the substrate processing apparatus such as a coating and developing apparatus including the inspection section, and to provide the substrate processing apparatus.

Means for Solving the Problems

In order to achieve the object stated above, the present invention is a method of controlling a substrate processing apparatus that includes: a loading/unloading section loading/unloading a substrate; a processing section processing the substrate; and an inspection section inspecting the substrate, the substrate transferable between the sections, wherein a substrate processing flow and a substrate inspection flow are independently executed, the substrate processing flow being a flow in which the substrate loaded into the loading/unloading section is carried to the processing section to be processed, and the substrate inspection flow being a flow in which the substrate loaded into the loading/unloading section is carried to the inspection section to be inspected.

According to the present invention, since the substrate processing flow and the substrate inspection flow are independently executed, it is possible to execute the substrate inspection flow at, for example, startup of the substrate processing apparatus and send, for example, an evaluation substrate loaded into the loading/unloading section directly to the inspection section to inspect the substrate. Since the inspection section can be evaluated based on the inspection result, a conventional specialized evaluation unit is not necessary, which can reduce cost involved in the evaluation unit. In addition, simultaneously executing the substrate inspection flow and the substrate processing flow allows the evaluation work of the inspection section and the adjustment work of the processing section to proceed simultaneously, so that the startup time of the substrate processing apparatus can be shortened. Moreover, since only the inspection section of the substrate processing apparatus can be independently used, it is possible to make use of the inspection section in the idle state, which can improve the operating rate of the inspection section.

A further possible structure is such that the substrate having undergone the substrate processing flow is returned to the loading/unloading section, and the substrate inspection flow is executed for the aforesaid substrate when the inspection section is not engaged in the inspection of another substrate. In such a case, since the substrate having undergone the substrate processing flow is returned to the loading/unloading section, a buffer or the like where the substrate is kept on standby need not be provided in, for example, the inspection section or the like. As a result, the footprint of the inspection section can be reduced, realizing downsizing of the whole apparatus.

A further possible structure is such that the substrate inspection flow is executed for an external substrate loaded into the loading/unloading section from an external part of the substrate processing apparatus, when the inspection section is not engaged in the inspection of the substrate having undergone the substrate processing flow. This external substrate is loaded into the loading/unloading section of the substrate processing apparatus only for an inspection purpose and has already been processed in, for example, another processing apparatus. In such a case, since a substrate already processed in, for example, another processing apparatus can be inspected, it is possible to, for example, reduce the number of inspection units of the whole factory where substrates are manufactured, resulting in reduced cost. Further, it is possible to improve the operating rate of the inspection section to improve processing efficiency of the whole factory.

A further possible structure is such that the substrate processing flow and the substrate inspection flow are executed in a unit of a lot of the substrates, the substrate inspection flow is executed for a lot having undergone the substrate processing flow, and the substrate inspection flow is executed for an external lot loaded into the loading/unloading section from an external part of the substrate processing apparatus in a manner that an execution period of the substrate inspection flow for the external lot does not overlap with an execution period of the substrate inspection flow for the lot having undergone the substrate processing flow. The substrate inspection flow for the lot having undergone the substrate processing flow may be given a priority over the substrate inspection flow for the external lot. In such a case, since the lot processed in this substrate processing apparatus is given a priority, the flow of the substrates in the substrate processing apparatus does not become stagnant, so that processing efficiency of the substrate processing apparatus can be maintained even in a case where the external lot is inspected. Note that the substrate inspection flow for the external lot may be given a priority over the substrate inspection flow for the lot having undergone the substrate processing flow.

A further possible structure is such that a predetermined inspection unit is selected from a plurality of inspection units provided in the inspection section and the substrate inspection flow in the selected inspection unit is executed for the substrate. In such a case, it is possible to freely select necessary inspection, for instance, in a unit of a substrate or in a unit of a lot.

A substrate processing apparatus of the present invention includes: a loading/unloading section loading/unloading a substrate; a processing section processing the substrate; and an inspection section inspecting the substrate, the substrate being transferable between the sections, and the substrate processing apparatus further including a control section capable of executing a substrate processing flow and a substrate inspection flow independently from each other, the substrate processing flow being a flow in which the substrate loaded into the loading/unloading section is carried to the processing section to be processed, and the substrate inspection flow being a flow in which the substrate loaded into the loading/unloading section is carried to the inspection section to be inspected.

According to the present invention, since the substrate processing flow and the substrate inspection flow can be independently executed, it is possible to execute the substrate inspection flow and send, for example, an evaluation substrate loaded into the loading/unloading section directly to the inspection section to be inspected there at, for example, startup of the substrate processing apparatus. Since the inspection section can be evaluated based on the inspection result, the conventional specialized evaluation unit is not necessary, which can reduce cost involved in the evaluation unit. In addition, simultaneously executing the substrate inspection flow and the substrate processing flow allows the evaluation work of the inspection section and the adjustment work of the processing section to proceed simultaneously, so that the startup time of the substrate processing apparatus can be shortened. Moreover, since only the inspection section of the substrate processing apparatus can be independently used, it is possible to make use of the inspection section in the idle state, which can improve the operating rate of the inspection section.

The control section may be capable of returning the substrate having undergone the substrate processing flow to the loading/unloading section and executing the substrate inspection flow for the substrate in the loading/unloading section when the inspection section is not engaged in the inspection of another substrate. In such a case, since the substrate having undergone the substrate processing flow is returned to the loading/unloading section, a buffer or the like where the substrate is kept on standby need not be provided in, for example, the inspection section or the like, which can reduce the footprint of the inspection section and realize downsizing of the whole apparatus.

The control section may be capable of executing the substrate inspection flow for an external substrate loaded into the loading/unloading section from an external part of the substrate processing apparatus, when the inspection section is not engaged in the inspection of the substrate having undergone the substrate processing flow. In such a case, since the substrate inspection flow is executed for the external substrate, it is possible to improve the operating rate of the inspection section.

The control section may be capable of executing the substrate processing flow and the substrate inspection flow in a unit of a lot of the substrates, executing the substrate inspection flow for a lot having undergone the substrate processing flow, and executing the substrate inspection flow for an external lot loaded into the loading/unloading section from an external part of the substrate processing apparatus in a manner that an execution period of the substrate inspection flow for the external lot does not overlap with an execution period of the substrate inspection flow for the lot having undergone the substrate processing flow. Further, the control section may be capable of giving a priority to the substrate inspection flow for the lot having undergone the substrate processing flow over the substrate inspection flow for the external lot. In such a case, since the inspection of the substrates processed in this substrate processing apparatus is given a priority, the flow of substrates in the substrate processing apparatus does not become stagnant, so that processing efficiency of the substrate processing apparatus can be maintained even in a case where the external substrates are inspected.

The control section may be capable of giving a priority to the substrate inspection flow for the external lot over the substrate inspection flow for the lot having undergone the substrate processing flow. Further, the control section may give a priority, in a switchable manner, either to the substrate inspection flow for the lot having undergone the substrate processing flow or to the substrate inspection flow for the external lot.

The inspection section may include a plurality of inspection units and the control section may be capable of selecting a predetermined inspection unit from the plural inspection units to execute the substrate inspection flow in the selected inspection unit for the substrate. In such a case, it is possible to freely select necessary inspection, for instance, in a unit of a substrate or in a unit of a lot.

Effect of the Invention

According to the present invention, in a substrate processing apparatus including an inspection section, it is possible to shorten the time taken for a startup work, reduce cost, and moreover, improve the operating rate of the inspection section.

EXPLANATION OF CODES

| | |
|---|---|
| 1 | coating and developing apparatus |
| 2 | cassette station |
| 3 | inspection station |
| 4 | processing station |
| 20, 21, 22 | inspection unit |
| 120 | control unit |
| $F_1$ | processing flow |
| $F_2$ | inspection flow |
| $C_1$~$C_4$ | cassette |
| $R_1$~$R_4$ | lot |
| $W_1$~$W_4$ | wafer |

BEST MODE FOR CARRYING OUT THE INVENTION

Figure 1:
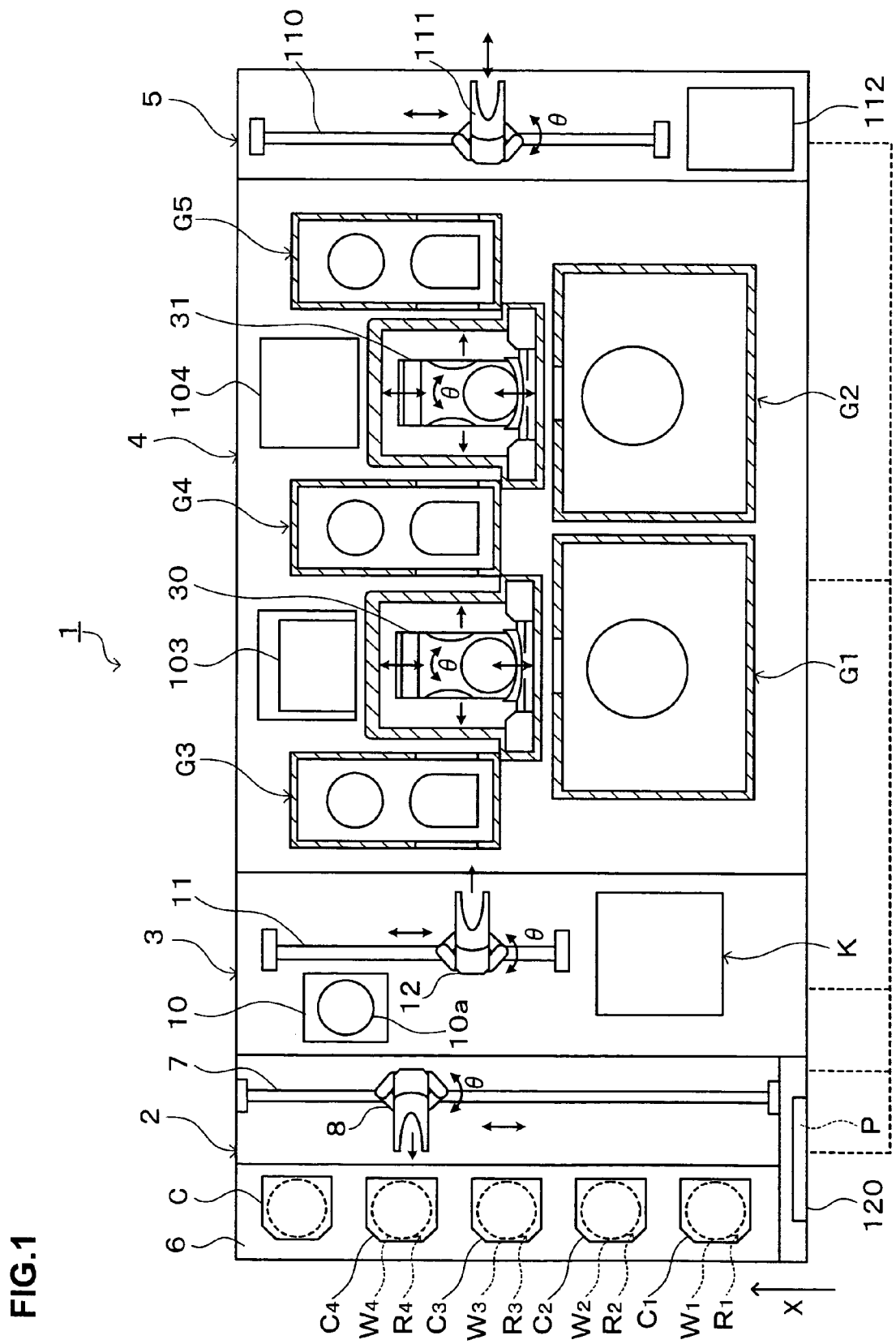
[FIG. 1]
A plane view showing an overview of the configuration of a coating and developing apparatus in this embodiment.
Figure 2:
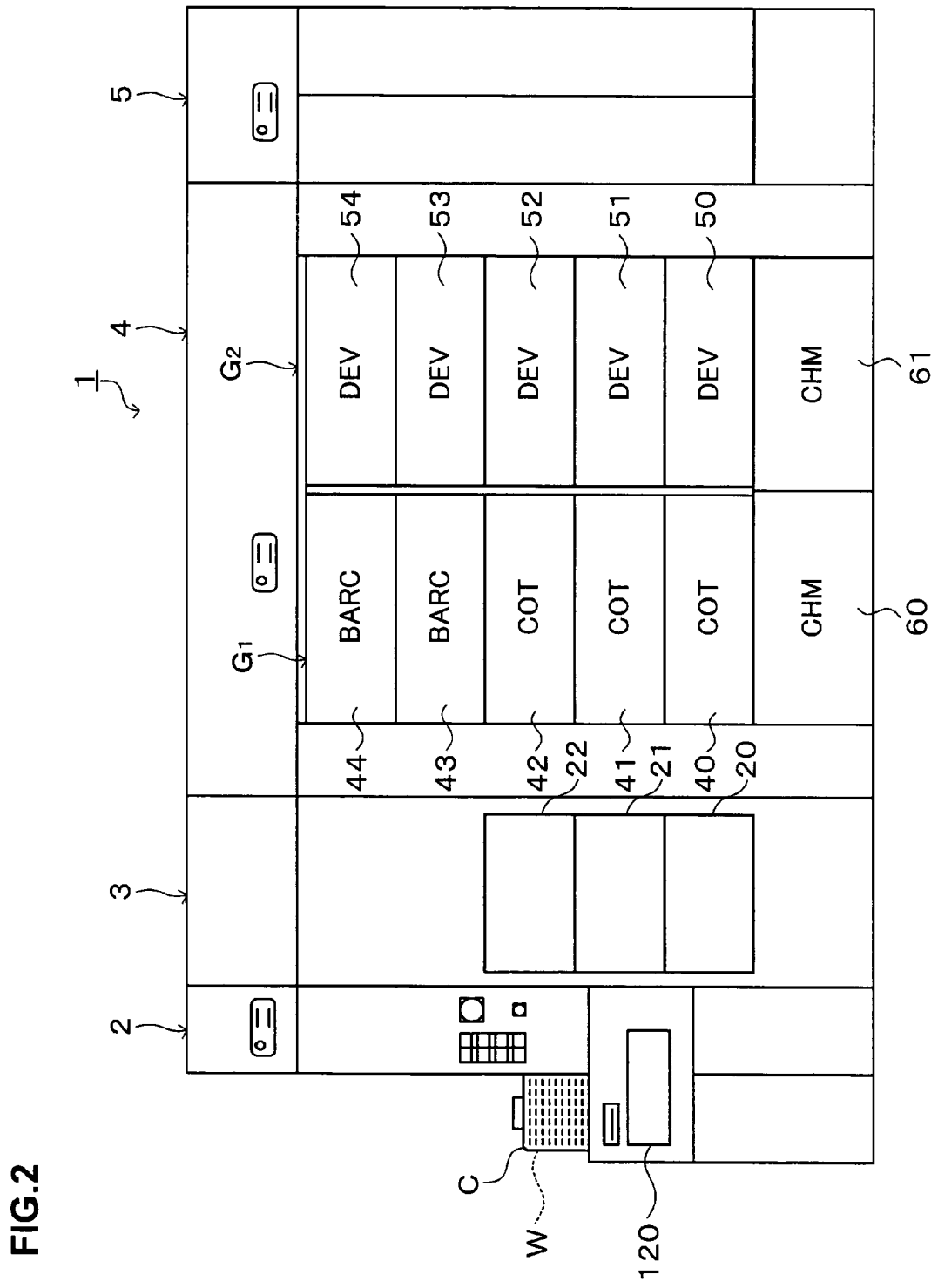
[FIG. 2]
A front view of the coating and developing apparatus in FIG. 1.
Figure 3:
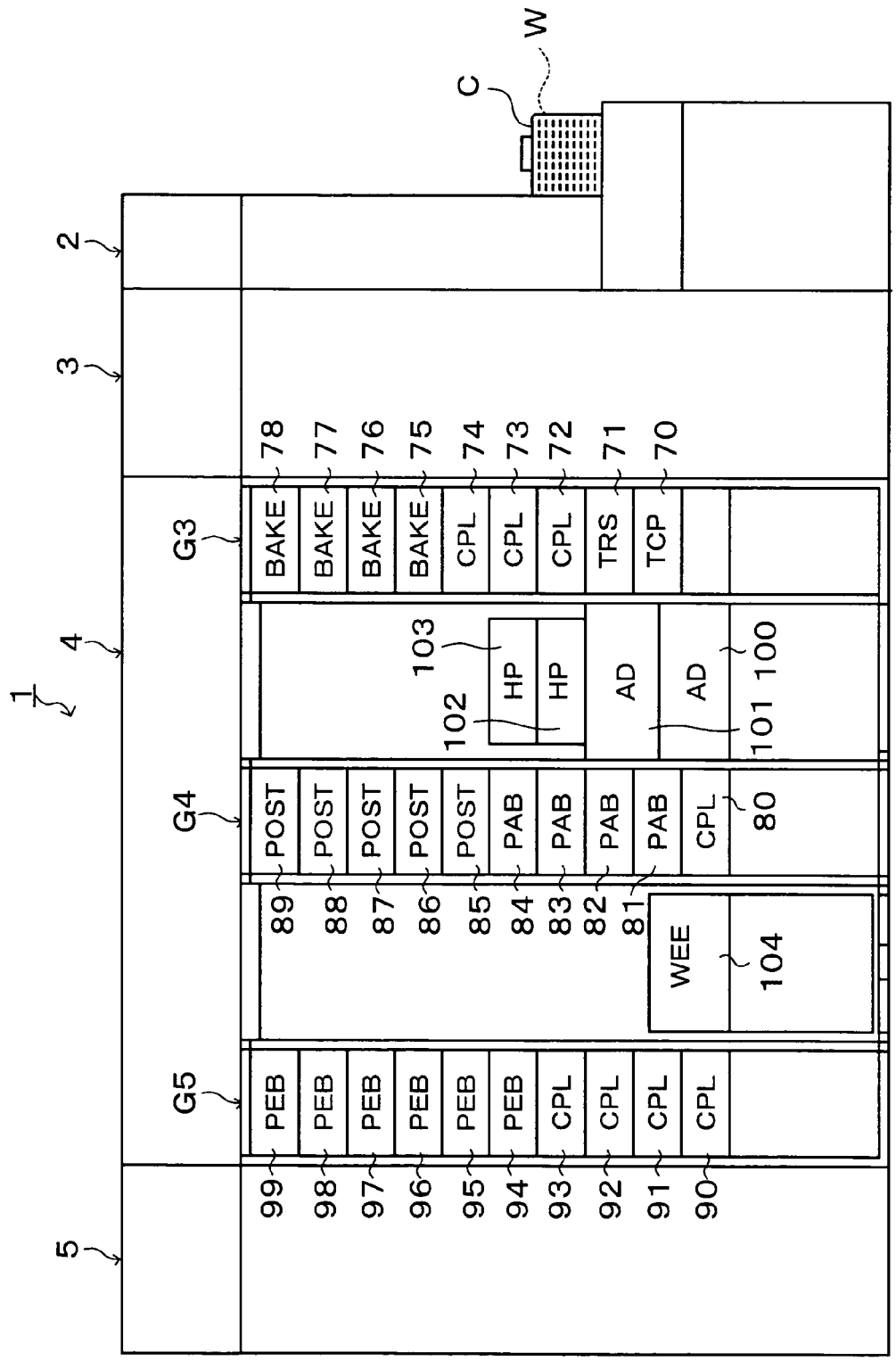
[FIG. 3]
A rear view of the coating and developing apparatus in FIG. 1

Hereinafter, a preferred embodiment of the present invention will be described. FIG. 1 is a plane view showing an overview of the configuration of a coating and developing apparatus 1 where a photolithography step of a wafer as a substrate is conducted, FIG. 2 is a front view of the coating and developing apparatus 1, and FIG. 3 is a rear view of the coating and developing apparatus 1.

As shown in FIG. 1, the coating and developing apparatus 1 is structured such that the following elements are integrally connected: a cassette station 2 as a loading/unloading section where, for example, 25 wafers W are loaded/unloaded in a unit of a cassette into/from the coating and developing apparatus 1 from/to an external part and the wafers W are loaded/unloaded to/from the cassettes C; an inspection station 3 as an inspection section inspecting the wafers W; a processing station 4 as a processing section including various kinds of processing units which are arranged in multi-tiers to apply predetermined processing wafer by wafer in a coating and developing step; and an interface section 5 delivering the wafer W to/from a not-shown aligner provided adjacent to the processing station 4.

In the cassette station 2, a plurality of, for example, five cassettes C can be placed at predetermined positions on a cassette mounting table 6 in line along an X direction (vertical direction in FIG. 1). In the cassette station 2, a wafer carrier 8 movable in the X direction on a carrier path 7 is provided. The wafer carrier 8 is also movable in an up/down direction, so that it is capable of selectively accessing the wafers W arranged in the up/down direction in the cassettes C. The wafer carrier 8 is rotatable in a θ direction around a plumb-line axis and is capable of accessing a delivery part 10 of a later-described inspection station 3 side.

The inspection station 3 adjacent to the cassette station 2 includes an inspection unit group K in which, for example, a plurality of inspection units are arranged in multi-tiers. The inspection station 3 includes the delivery part 10 delivering the wafer W to/from the cassette station 2. The delivery part 10 has, for example, a mounting part 10a for placing the wafer W thereon. The inspection station 3 includes, for example, a wafer carrier unit 12 moving on a carrier path 11 extending in the X direction. The wafer carrier unit 12 is movable, for example, in the up/down direction and also rotatable in the θ direction, so that it is capable of accessing the later-described inspection units in the inspection unit group K, the delivery part 10, and later-described processing units in a third processing unit group G3 of the processing station 4.

As shown in, for example, FIG. 2, in the inspection unit group K, a film thickness/line width inspection unit 20 measuring thickness of a film formed on the wafer W and line width of its pattern, a macrodefect inspection unit 21 detecting a macrodefect on a wafer surface, and an overlay inspection unit 22 detecting an overlay offset of exposure are stacked in three tiers in this order from the bottom.

The processing station 4 adjacent to the inspection station 3 includes, for example, five processing unit groups G1 to G5 in each of which a plurality of processing units are arranged in multi-tiers, as shown in FIG. 1. On an X-direction negative side (lower side in FIG. 1) of the processing station 4, the first processing unit group G1 and the second processing unit group G2 are arranged in this order from the inspection station 3 side. On an X-direction positive side (upper side in FIG. 1) of the processing station 4, the third processing unit group G3, the fourth processing unit group G4, and the fifth processing unit group 5 are arranged in this order from the inspection station 3 side. Between the third processing unit group G3 and the fourth processing unit group G4, a first carrier unit 30 is provided. The first carrier unit 30 is capable of selectively accessing the first processing unit group G1, the third processing unit group G3, and the fourth processing unit group G4 to carry the wafer W thereto. Between the fourth processing unit group G4 and the fifth processing unit group G5, a second carrier unit 31 is provided. The second carrier unit 31 is capable of selectively accessing the second processing unit group G2, the fourth processing unit group G4, and the fifth processing unit group G5 to carry the wafer W thereto.

As shown in FIG. 2, in the first processing unit group G1, liquid processing units each supplying a predetermined liquid to the wafer W to process the wafer W, such as for example, resist coating units 40, 41, 42 coating the wafer W with a resist solution and bottom coating units 43, 44 forming an anti-reflection film preventing the reflection of light at the time of the exposure processing are stacked in five tiers in this order from the bottom. In the second processing unit group G2, liquid processing units such as, for example, developing units 50 to 54 developing the wafer W are stacked in five tiers in this order from the bottom. Further, on the bottom tiers of the first processing unit group G1 and the second processing unit group G2, chemical chambers 60, 61 supplying various kinds of processing solutions to the liquid processing units in the processing unit groups G1 and G2 are provided respectively.

As shown in, for example, FIG. 3, in the third processing unit group G3, a temperature control unit 70, a transition unit 71 delivering the wafer W, high-accuracy temperature control units 72 to 74 heat-treating the wafer W under an accurate controlled temperature, and high-temperature heat treatment units 75 to 78 heat-treating the wafer W at a high temperature are stacked in nine tiers in this order from the bottom.

In the fourth processing unit group G4, for example, a high-accuracy temperature control unit 80, pre-baking units 81 to 84 heat-treating the wafer W having undergone resist coating processing, and post-baking units 85 to 89 heat-treating the wafer W having undergone development processing are stacked in ten tiers in this order from the bottom.

In the fifth processing unit group G5, a plurality of heat-treatment units heat-treating the wafer W, such as, for example, high-accuracy temperature control units 90 to 93 and post-exposure baking units 94 to 99 heat-treating the wafer W having undergone exposure are stacked in ten tiers in this order from the bottom.

As shown in FIG. 1, on the X-direction positive side of the first carrier unit 30, arranged are a plurality of processing units, namely, for example, adhesion units 100, 101 applying hydrophobic treatment to the wafer W and heating units 102, 103 heating the wafer W are stacked in four tiers in this order from the bottom as shown in FIG. 3. As shown in FIG. 1, on the X-direction positive side of the second carrier unit 31, provided is, for example, an edge exposure unit 104 selectively exposing only an edge portion of the wafer W.

As shown in, for example, FIG. 1, the interface section 5 includes a wafer carrier 111 moving on a carrier path 110 extending in the X direction and a buffer cassette 112. The wafer carrier 111 is movable in a Z direction and rotatable in the θ direction, so that it is capable of accessing the not-shown aligner adjacent to the interface section 5, the buffer cassette 112, and the fifth processing unit group G5 to carry the wafer W thereto.

Figure 4:
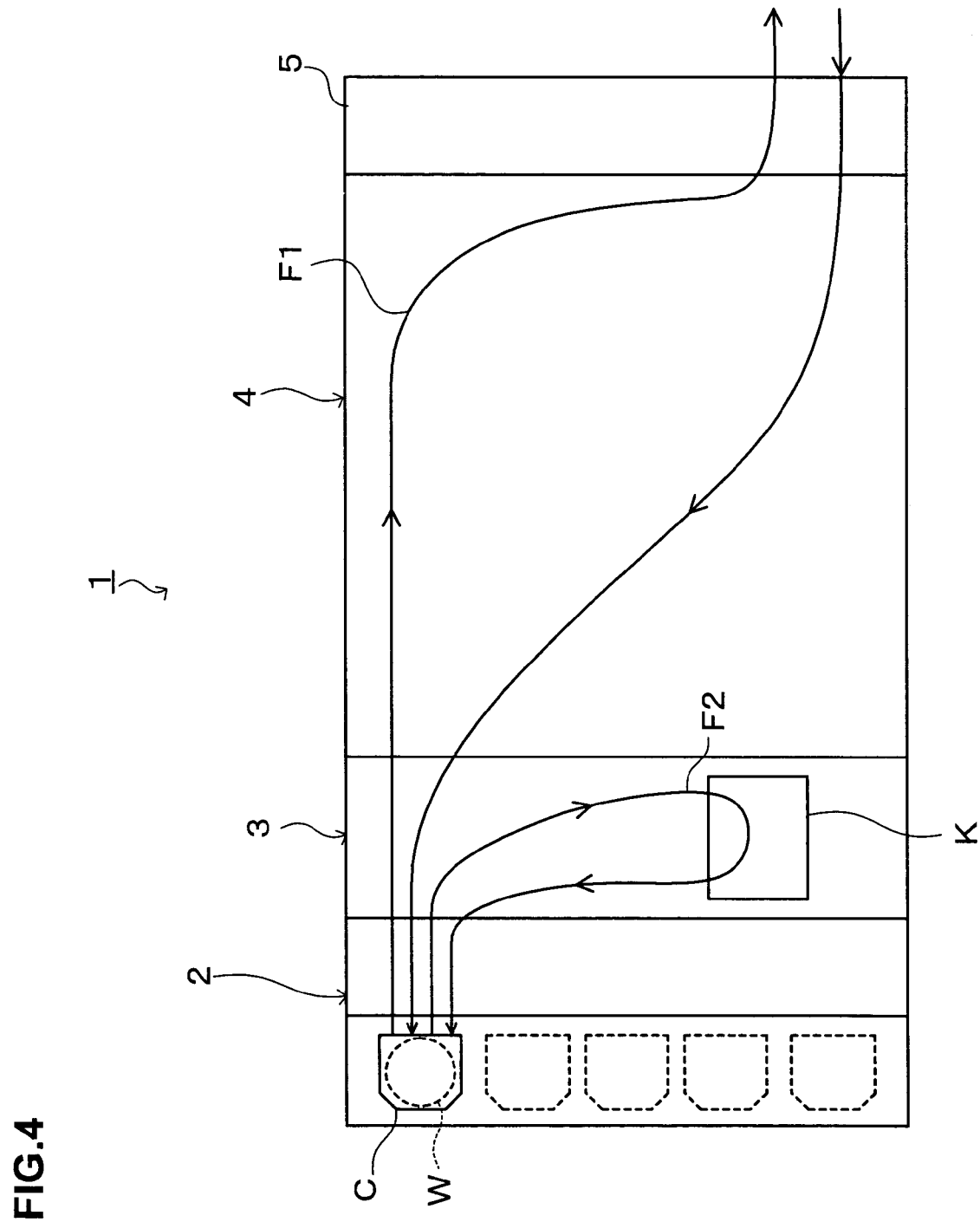
[FIG. 4]
An explanatory view showing a processing flow and an inspection flow set in the coating and developing apparatus.

The coating and developing apparatus 1 as configured above is controlled by a control unit 120 as a control section provided in a side portion of the cassette station 2 as shown in, for example, FIG. 1 and FIG. 2. A control program P is stored in the control unit 120, and the control unit 120 controls the operations of the processing units, the inspection units, and the carrier units in the coating and developing apparatus 1 according to the control program P to be capable of controlling wafer processing processes in the coating and developing apparatus 1. As shown in, for example, FIG. 4, the control program P is set so that a processing flow $F_1$ for the wafer W and an inspection flow $F_2$ for the wafer W can be independently executed, the processing flow $F_1$ being a flow in which the wafer W in the cassette station 2 is carried to the processing station 4 through the inspection station 3 and after the wafer W is processed in the processing station 4 and the aligner, the wafer W is returned to the cassette station 2 through the inspection station 3, and the inspection flow $F_2$ being a flow in which the wafer W in the cassette station 2 is carried to the inspection station 3, and after undergoing predetermined inspection, the wafer W is returned to the cassette station 2.

Next, the operation of the coating and developing apparatus 1 as configured above will be described. First, at startup of the coating and developing apparatus 1, for example, the processing flow $F_1$ and the inspection flow $F_2$ of the control program P are executed by the control unit 120. For example, when the cassette C housing evaluation wafers W are placed on the cassette mounting table 6, the evaluation wafer W is delivered to the delivery part 10 by the wafer carrier 7, is carried to the inspection units 20 to 22 from the delivery part 10 by the wafer carrier unit 12, and is returned to the cassette C via the wafer carrier unit 12, the delivery part 10, and the wafer carrier 8 when the inspection in each of the inspection units 20 to 22 is finished. An evaluation work of the inspection units 20 to 22 is done by, for example, evaluating measurement values in the inspection units 20 to 22 regarding the evaluation wafers W. Further, for example, when the cassette C housing wafers W to be processed is placed on the cassette mounting table 6, the wafer W to be processed is carried to the processing station 4 via the wafer carrier 8, the delivery part 10, and the wafer carrier unit 12, is processed in a predetermined processing unit as a target of adjustment, and thereafter is returned to the cassette C again via the wafer carrier unit 12, the delivery part 10, and the wafer carrier 8. An adjustment work of each of the processing units is done by, for example, adjusting the setting of each of the processing units based on the processing state of the wafer W returned to the cassette C.

Figure 5:
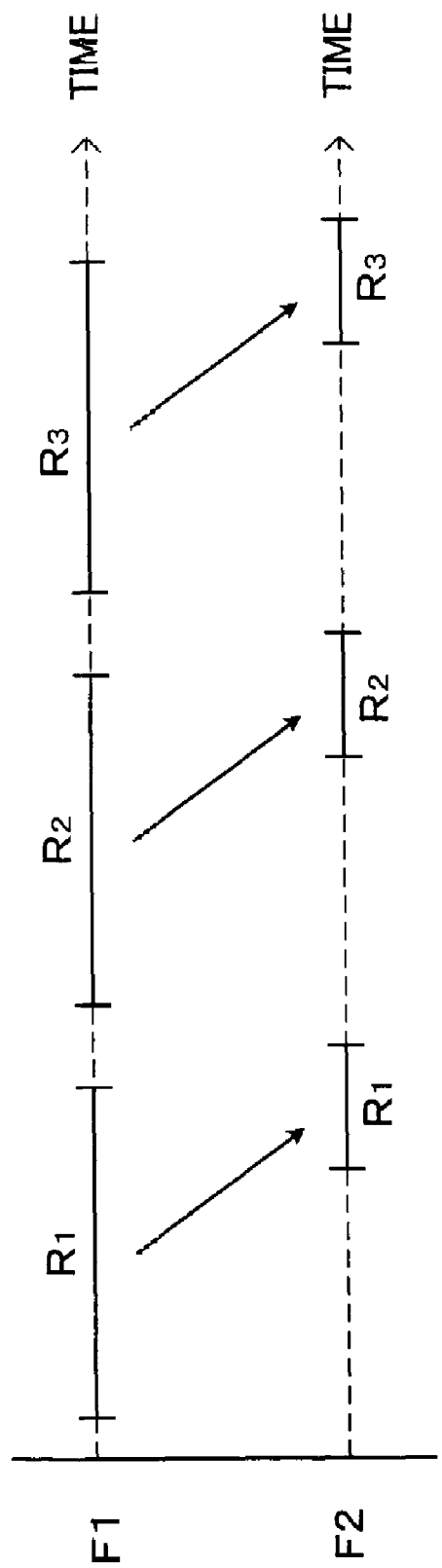
[FIG. 5]
An explanatory chart showing execution timings of the processing flow and the inspection flow.

The next description will be on the operation of the coating and developing apparatus 1 when the startup work of the coating and developing apparatus 1 is finished and the wafer W is actually processed in the coating and developing apparatus 1. In this embodiment, such a case is taken as an example where there are cassettes $C_1$, $C_2$, $C_3$ placed on the cassette mounting table 6 as shown in, for example, FIG. 1, the cassette $C_1$ housing a plurality of wafers $W_1$ constituting a lot $R_1$, the cassette $C_2$ housing a plurality of wafers $W_2$ constituting a lot $R_2$, and the cassette $C_3$ housing a plurality of wafers $W_3$ constituting a lot $R_3$. FIG. 5 is an explanatory chart showing execution timings of the processing flow $F_1$ and the inspection flow $F_2$.

First, when the coating and developing apparatus 1 is put into operation, for example, the control unit 120 is brought into a state in which it is capable of executing both the processing flow $F_1$ and the inspection flow $F_2$ of the control program P. By executing the processing flow $F_1$ for the lot $R_1$, the plural wafers $W_1$ in the cassette $C_1$ placed on the cassette mounting table 6 are delivered one by one to the delivery part 10 by the wafer carrier 8, and are carried by the wafer carrier unit 12 to the temperature control unit 70 belonging to the third processing unit group G3 of the processing station 4. In the processing station 4, each of the wafers $W_1$ is subjected to temperature control processing by the temperature control unit 70, formation processing of the anti-reflection film by the bottom coating unit 43, heat treatment by the heating unit 102, high-temperature heat treatment by the high-temperature heat treatment unit 75, temperature adjustment by the high-accuracy temperature control unit 80, resist coating processing by the resist coating unit 40, pre-baking processing by the pre-baking unit 81, edge exposure processing by the edge exposure unit 104, and temperature adjustment by the high-accuracy temperature control unit 93 in sequence. Thereafter, the wafers $W_1$ are sequentially carried to the aligner via the interface section 5 by the wafer carrier 111 to be returned into the processing station 4 again via the interface section 5 after the end of the exposure processing.

Thereafter, each of the wafers $W_1$ is subjected to heat treatment by the post-exposure baking unit 94, temperature adjustment by the high-accuracy temperature control unit 91, development processing by the developing unit 50, heat treatment by the post-baking unit 85, and cooling processing by the high-accuracy temperature control unit 72 in sequence, and are delivered to the delivery part 10 of the inspection station 3 from the transition unit 71 by the wafer carrier unit 12. The wafers $W_1$ are returned to the cassette $C_1$ from the delivery part 10 by the wafer carrier 8.

After the processing flow $F_1$ for the lot $R_1$ in the cassette $C_1$ is executed and all the wafer $W_1$ are taken out of the cassette $C_1$, the processing flow $F_1$ for the lot $R_2$ in the cassette $C_2$ on the cassette mounting table 6 is subsequently executed as shown in FIG. 5, that is, the plural wafers $W_2$ are taken out of the cassette $C_2$, pass through the same route as the wafers $W_1$, and are processed. Then, when the cassette $C_2$ becomes empty, the processing flow $F_1$ is executed for the lot $R_3$ in the cassette $C_3$, that is, the wafers $W_3$ also pass through the same route to be processed. In this manner, the processing flow $F_1$ is executed for the lots $R_1$ to $R_3$ in sequence.

Meanwhile, after the wafers $W_1$ of the lot $R_1$ having undergone the processing flow $F_1$ are returned to the cassette $C_1$, the inspection flow $F_2$ is executed, so that several wafers $W_1$ selected from the lot $R_1$ are carried one by one to the delivery part 10 of the inspection station 3 by the wafer carrier 8. These wafers $W_1$ are carried by the wafer carrier unit 12 to, for example, the film thickness/line width inspection unit 20, the macro defect inspection unit 21, and the overlay inspection unit 22 of the inspection unit group K in sequence and undergo predetermined inspection in each of the inspection units. The wafers $W_1$ having been inspected are delivered to the delivery part 10 by the wafer carrier unit 12 and are returned to the cassette $C_1$ from the delivery part 10 by the wafer carrier 8. Further, the inspection flow $F_2$ is also executed similarly for the lots $R_2$, $R_3$ having undergone the processing flow $F_1$ and returned to the cassettes $C_2$, $C_3$.

Figure 6:
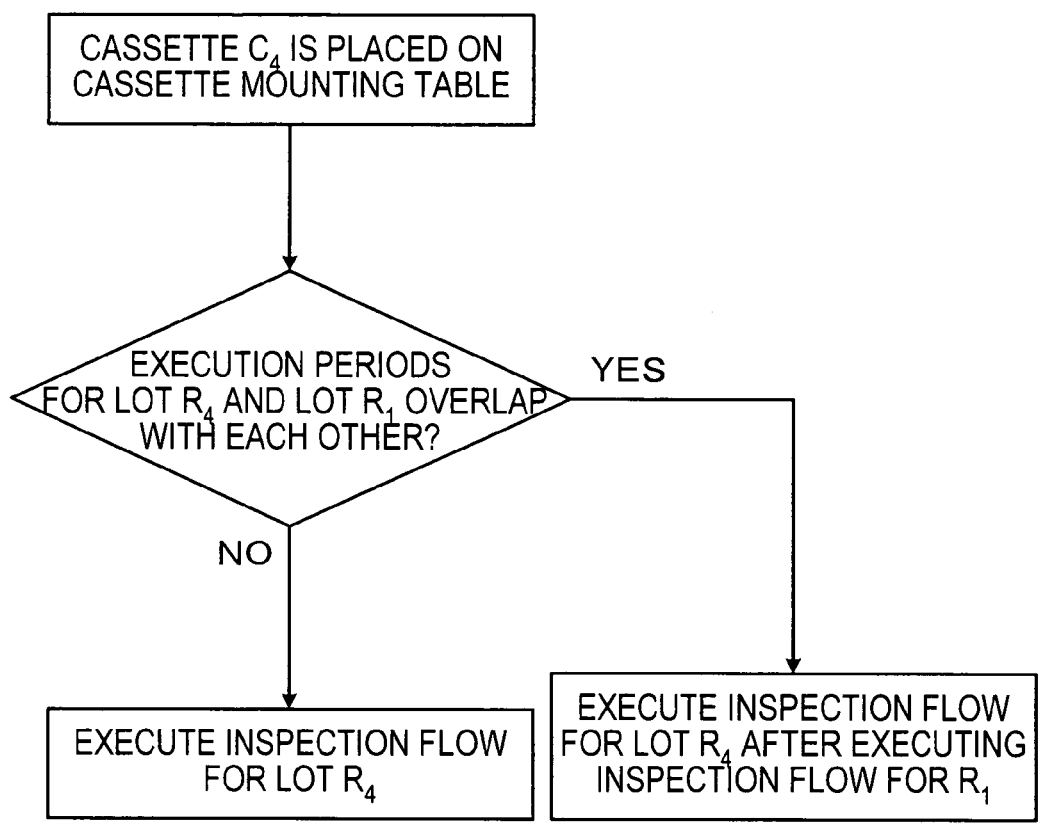
[FIG. 6]
A flowchart in a case where the inspection flow is executed for a lot loaded from an external part.
Figure 7:
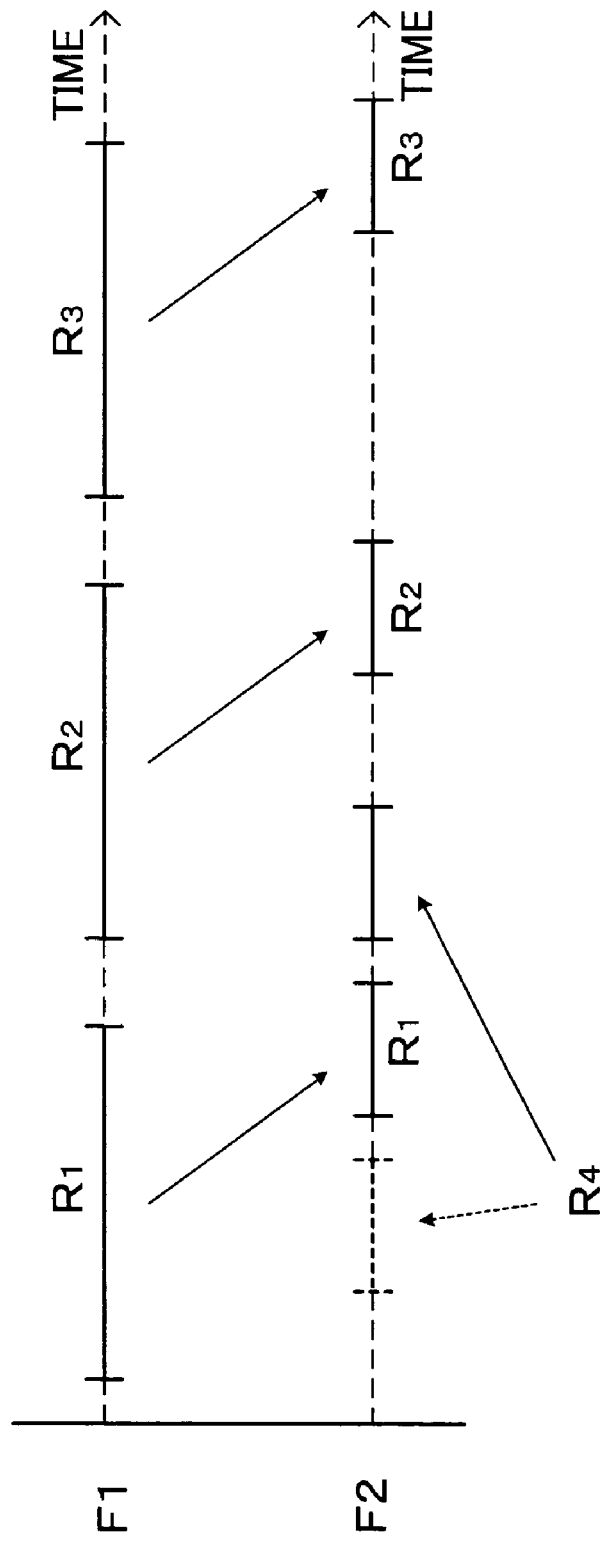
[FIG. 7]
An explanatory chart showing an execution timing of the inspection flow for the lot loaded from the external part.

The next description will be on a case where a cassette $C_4$ is placed on the cassette mounting table 6 from an external part of the apparatus as shown in FIG. 1, only for the inspection purpose. For example, the cassette $C_4$ houses a plurality of wafers $W_4$ constituting a lot $R_4$ having undergone processing in another processing apparatus. FIG. 6 shows a flowchart in this case. When the cassette $C_4$ of the lot $R_4$ is placed on the cassette mounting table 6 during the execution of, for example, the processing flow $F_1$ for the lot $R_1$, and the execution of the inspection flow $F_2$ for the lot $R_4$ is started at this point in time, it is confirmed in, for example, the control unit 120 whether or not an execution period for the lot $R_4$ overlaps with an execution period of the next inspection flow $F_2$ for the lot $R_1$ being processed in the coating and developing apparatus 1. In a case where the execution periods overlap with each other, the inspection flow $F_2$ for the lot $R_1$ is executed first, and the lot $R_4$ is kept on standby at this time in the cassette $C_4$ placed on the cassette mounting table 6. Then, as shown in FIG. 7, the inspection flow $F_2$ for the lot $R_4$ is executed after the inspection of the lot $R_1$ is finished.

On the other hand, in a case where the execution periods do not overlap with each other, the inspection flow $F_2$ for the lot $R_4$ is immediately executed. In this manner, the inspection flow $F_2$ for the lot $R_1$ processed in the coating and developing apparatus 1 is executed with a higher priority over the inspection flow $F_2$ for the external lot $R_4$, Likewise, in a case where the processing flow $F_1$ for the lot $R_2$ or the lot $R_3$ is being executed when the cassette $C_4$ is placed on the cassette mounting table 6, if the execution periods of the inspection flow $F_2$ overlap with each other, a priority is given to the subsequent inspection flow $F_2$ for the lot $R_2$ or the lot $R_3$ over the inspection flow $F_2$ for the lot $R_4$, whereby the adjustment is made so that the execution period of the inspection flow $F_2$ for the lot $R_4$ does not overlap with the execution period for the lots $R_2$, $R_3$.

According to the embodiment described above, since the processing flow $F_1$ and the inspection flow $F_2$ of the control program P can be independently executed by the control unit 120, the evaluation work of the inspection units 20 to 22 of the inspection station 3 and the adjustment work of the processing units of the processing station 4 can proceed simultaneously at, for example, startup of the coating and developing apparatus 1. Therefore, the time taken for the startup work is shortened. In addition, since the inspection units 20 to 22 can be accessed directly from the cassette station 2 of the coating and developing apparatus 1, a specialized evaluation unit conventionally needed for the evaluation work is not necessary, which can reduce cost involved in the evaluation unit.

Moreover, even while the execution of the processing flow $F_1$ is underway in the coating and developing apparatus 1, the inspection flow $F_2$ can be executed for the external lot $R_4$ if the inspection units 20 to 22 are idle, so that the operating rate of the inspection units 20 to 22 can be improved. Further, since the inspection flow $F_2$ for the lots $R_1$ to $R_3$ having undergone the processing flow $F_1$ in the coating and developing apparatus 1 is given a priority over the inspection flow $F_2$ for the external lot $R_4$, even executing the inspection of the external lot $R_4$ does not lower wafer processing efficiency in the coating and developing apparatus 1.

Figure 8:
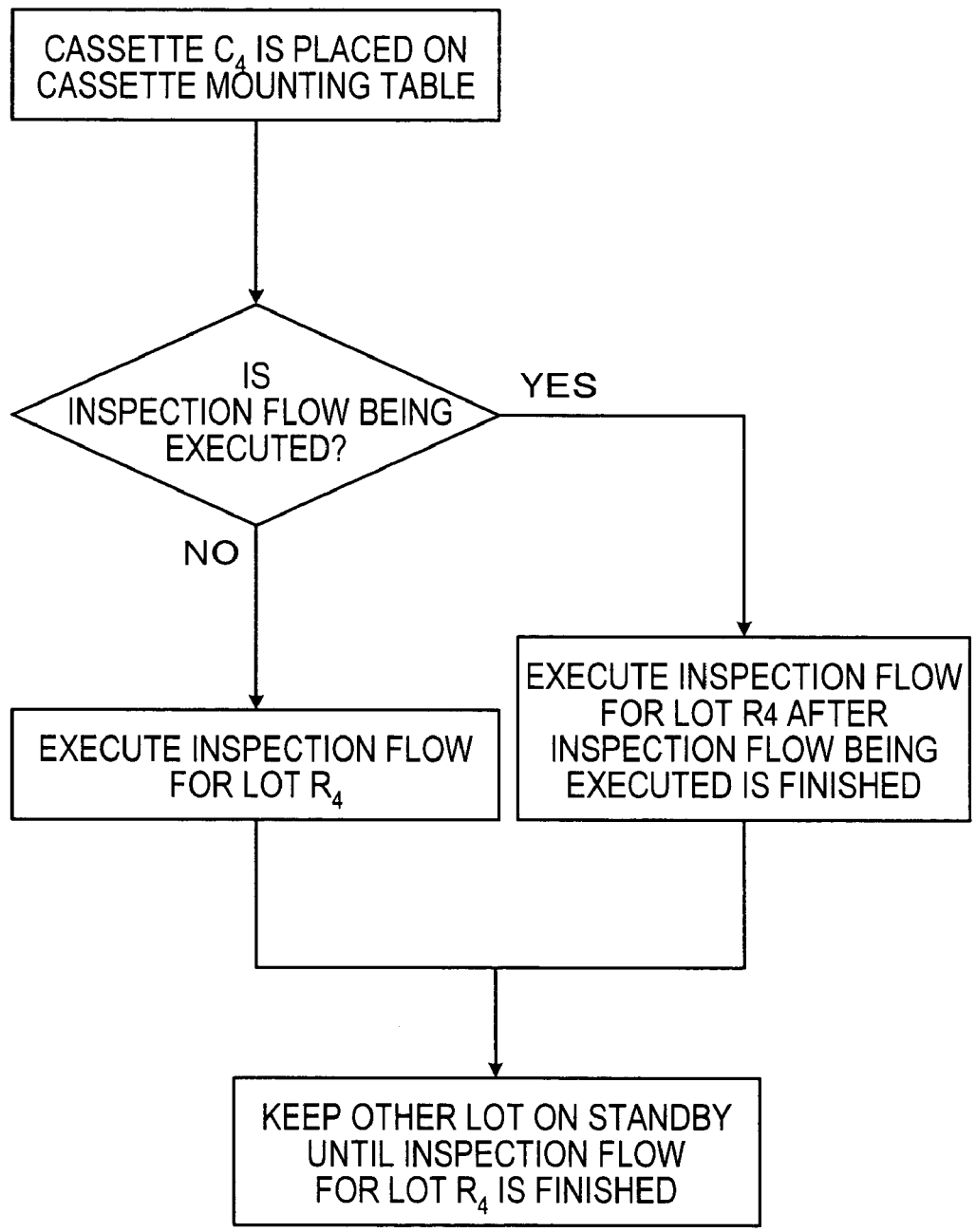
[FIG. 8]
A flowchart in a case where the inspection flow for the lot loaded from the external part is executed.

In the embodiment described above, the execution of the inspection flow $F_2$ for the lots $R_1$ to $R_3$ processed in the coating and developing apparatus 1 is given a priority over the execution of the inspection flow $F_2$ for the lot $R_4$ loaded into the cassette mounting table 6 from the external part, but the inspection flow $F_2$ for the external lot $R_4$ may be given a priority. FIG. 8 shows a flowchart in this case. For example, when the external cassette $C_4$ is placed on the cassette mounting table 6, it is confirmed whether or not the inspection flow $F_2$ is being executed for another lot at this time. In a case where the inspection flow $F_2$ is being executed, the lot $R_4$ is kept on standby on the cassette mounting table 6 until the inspection flow $F_2$ being executed is finished, and thereafter, the inspection flow $F_2$ for the lot $R_4$ is executed. In a case where the inspection flow $F_2$ is not being executed for another lot when the cassette $C_4$ is placed on the cassette mounting table 6, the inspection flow $F_2$ for the lot $R_4$ is immediately executed. In a case where, for example, the lots $R_1$ to $R_3$ having undergone the processing flow $F_1$ in the coating and developing apparatus 1 are returned to the cassettes $C_1$ to $C_3$ during the execution of the inspection flow $F_2$ for the lot $R_4$, the lots $R_1$ to $R_3$ are kept on standby on the cassette mounting table 6 until the inspection flow $F_2$ for the lot $R_4$ is finished. The inspection flow $F_2$ for the lots $R_1$ to $R_3$ is executed after the inspection flow $F_2$ for the lot $R_4$ is finished. In this example, it is possible to inspect, for example, the lot $R_4$ under a certain condition with a higher priority over the lots in the coating and developing apparatus 1.

Note that the control unit 120 may be capable of switching between a mode in which the inspection flow $F_2$ for the external lot $R_4$ is given a priority and the mode in which the inspection flow $F_2$ for the lots $R_1$ to $R_3$ processed in the coating and developing apparatus 1 is given a priority. In such a case, either the external lot $R_4$ or the internal lots $R_1$ to $R_3$ can be given a priority as required.

The processing flow $F_1$ in the embodiment described above is to carry the wafer W from the cassette station 2 to the processing station 4 and thereafter return the wafer W directly to the cassette station 2 after it is processed in the processing station 4 and the aligner, but it is also possible that the wafers W having been processed in the cassette station 4 and the aligner are selectively inspected in the inspection station 3 and thereafter are returned to the cassette station 2. In such a case, if the inspection units 20 to 22 are idle, for example, when a series of processing in the processing station 4 and the aligner is finished and the wafer W passes through the inspection station 3, the wafer W is inspected in the inspection units 20 to 22 and thereafter is returned to the cassette station 2, and if the inspection units 20 to 22 are not idle, the wafer W is directly returned to the cassette station 2. The wafer W that is not inspected is inspected by the execution of the inspection flow 2 after it is returned to the cassette station 2. This can prevent a case where the wafer W passes through the inspection station 3 to be returned to the cassette station 2 even though the inspection units 20 to 22 are idle, so that the operating rate of the inspection units 20 to 22 can be improved.

The inspection units 20 to 22 in the inspection unit group K where the inspection is performed in the aforesaid inspection flow $F_2$ may be arbitrarily selectable, for example, depending on each lot or depending on each wafer. Further, inspection conditions such as the position and range to be inspected in the same inspection units 20 to 22 may be changeable depending on each wafer or depending on each lot.

The foregoing embodiment only shows an example of the present invention, and the present invention is not limited to this example and may take various forms. For example, the kind and number of the inspection units in the inspection station 3 in the above-described embodiment may be arbitrarily selected. Further, in the coating and developing apparatus 1 of the above-described embodiment, the inspection station 3 is provided between the cassette station 2 and the processing station 4, but the inspection station 3 may be provided, for example, between the processing station 4 and the interface section 5. In the embodiment described above, the present invention is applied to the coating and developing apparatus 1, but the present invention is also applicable to other substrate processing apparatuses such as, for example, a cleaning apparatus, an etching apparatus, and the like. Further, the above-described embodiment is the coating and developing apparatus that processes the wafer W, but the present invention is also applicable to substrates other than a wafer, for example, other substrates such as a FPD (flat panel display) substrate, a mask substrate, and a reticle substrate.

INDUSTRIAL APPLICABILITY

The present invention is useful for shortening the startup time of a substrate processing apparatus having a substrate inspection section and improving the operating rate of the inspection section.

What is claimed is:

1. A method of controlling a substrate processing apparatus that comprises:
   a loading/unloading section loading/unloading a substrate;
   a processing section processing the substrate; and
   an inspection section inspecting the substrate, the substrate being transferable between the sections,
   wherein a substrate processing flow and a substrate inspection flow are independently executed, the substrate processing flow being a flow in which the substrate loaded into the loading/unloading section is carried to the Processing section to be processed, and the substrate inspection flow being a flow in which the substrate loaded into the loading/unloading section is carried to the inspection section to be inspected, and
   wherein the substrate inspection flow is executed for an external substrate that is loaded into the loading/unloading section from an external part of the substrate processing apparatus, when the inspection section is not engaged in the inspection of the substrate having undergone the substrate processing flow.

2. A method of controlling a substrate processing apparatus that comprises:
   a loading/unloading section loading/unloading a substrate;
   a processing section processing the substrate; and
   an inspection section inspecting the substrate, the substrate being transferable between the sections,
   wherein a substrate processing flow and a substrate inspection flow are independently executed, the substrate processing flow being a flow in which the substrate loaded into the loading/unloading section is carried to the processing section to be processed, and the substrate inspection flow being a flow in which the substrate loaded into the loading/unloading section is carried to the inspection section to be inspected, and
   wherein the substrate processing flow and the substrate inspection flow are executed in a unit of a lot of the substrates, the substrate inspection flow is executed for a lot having undergone the substrate processing flow, and the substrate inspection flow is executed for an external lot loaded into the loading/unloading section from an external part of the substrate processing apparatus in a manner that an execution period of the substrate inspection flow for the external lot does not overlap with an execution period of the substrate inspection flow for the lot having undergone the substrate processing flow.

3. The method of controlling the substrate processing apparatus according to claim 2, wherein the substrate having undergone the substrate processing flow is returned to the loading/unloading section, and the substrate inspection flow for the substrate in the loading/unloading section is executed when the inspection section is not engaged in the inspection of another substrate.

4. The method of controlling the substrate processing apparatus according to claim 2, wherein the substrate inspection flow for the lot having undergone the substrate processing flow is given a priority over the substrate inspection flow for the external lot.

5. The method of controlling the substrate processing apparatus according to claim 2, wherein the substrate inspection flow for the external lot is given a priority over the substrate inspection flow for the lot having undergone the substrate processing flow.

6. The method of controlling the substrate processing apparatus according to claim 2, wherein a predetermined inspection unit is selected from a plurality of inspection units provided in the inspection section and the substrate inspection flow in the selected inspection unit is executed for the substrate.

7. A substrate processing apparatus comprising:

a loading/unloading section for loading/unloading a substrate;

a processing section for processing the substrate; and an inspection section for inspecting the substrate, the substrate being transferable between said sections, and the substrate processing apparatus further comprising:

a control section for executing a substrate processing flow and a substrate inspection flow independently from each other in the substrate processing apparatus, the substrate processing flow being a flow in which the substrate loaded into said loading/unloading section is carried to said processing section to be processed, and the substrate inspection flow being a flow in which the substrate loaded into said loading/unloading section is carried to said inspection section to be inspected, wherein said control section executes the substrate inspection flow for an external substrate loaded into said loading/unloading section from an external part of the substrate processing apparatus, when said inspection section is not engaged in the inspection of the substrate having undergone the substrate processing flow.

8. The substrate processing apparatus according to claim 7, wherein said control section returns the substrate having undergone the substrate processing flow to said loading/unloading section, and executes the substrate inspection flow for the substrate in said loading/unloading section when said inspection section is not engaged in the inspection of another substrate.

9. A substrate processing apparatus comprising:

a loading/unloading section for loading/unloading a substrate;

a processing section for processing the substrate; and an inspection section for inspecting the substrate, the substrate being transferable between said sections, and the substrate processing apparatus further comprising:

a control section for executing a substrate processing flow and a substrate inspection flow independently from each other in the substrate processing apparatus, the substrate processing flow being a flow in which the substrate loaded into said loading/unloading section is carried to said processing section to be processed, and the substrate inspection flow being a flow in which the substrate loaded into said loading/unloading section is carried to said inspection section to be inspected, wherein said control section executes the substrate processing flow and the substrate inspection flow in a unit of a lot of the substrates, executes the substrate inspection flow for a lot having undergone the substrate processing flow, and executes the substrate inspection flow for an external lot loaded into said loading/unloading section from an external part of the substrate processing apparatus in a manner that an execution period of the substrate inspection flow for the external lot does not overlap with an execution period of the substrate inspection flow for the lot having undergone the substrate processing flow.

10. The substrate processing apparatus according to claim 9, wherein said control section gives a priority to the substrate inspection flow for the lot having undergone the substrate processing flow over the substrate inspection flow for the external lot.

11. The substrate processing apparatus according to claim 9, wherein said control section gives a priority to the substrate inspection flow for the external lot over the substrate inspection flow for the lot having undergone the substrate processing flow.

12. The substrate processing apparatus according to claim 9, wherein said control section gives a priority, in a switchable manner, either to the substrate inspection flow for the lot having undergone the substrate processing flow or to the substrate inspection flow for the external lot.

13. The substrate processing apparatus according to claim 9, wherein said inspection section includes a plurality of inspection units, and wherein said control section selects a predetermined inspection unit from the plural inspection units to execute the substrate inspection flow in the selected inspection unit for the substrate.

14. The substrate processing apparatus according to claim 9, wherein said control section controls said loading/unloading section, said processing section, and said inspection section.

* * * * *